United States Patent
Sailor

(10) Patent No.: US 6,964,575 B1
(45) Date of Patent: Nov. 15, 2005

(54) SEALED ELECTRONIC MODULE WITH SEAL-IN-PLACE CONNECTOR HEADER

(75) Inventor: Steven L. Sailor, Westfield, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/053,129

(22) Filed: Feb. 8, 2005

(51) Int. Cl.[7] .......................................... H01R 12/00
(52) U.S. Cl. .................................. 439/76.1; 439/936
(58) Field of Search ............................... 439/76.1, 936, 439/676, 686; 361/736, 679

(56) References Cited

U.S. PATENT DOCUMENTS

| | | | | |
|---|---|---|---|---|
| 4,997,526 A | * | 3/1991 | Robblee | 205/780.5 |
| 5,248,267 A | * | 9/1993 | Weng | 439/676 |
| 5,703,754 A | | 12/1997 | Hinze | |
| 6,431,884 B1 | * | 8/2002 | Wallace et al. | 439/86 |
| 6,709,291 B1 | * | 3/2004 | Wallace et al. | 439/607 |

* cited by examiner

Primary Examiner—Gary Paumen
Assistant Examiner—Phuongchi Nguyen
(74) Attorney, Agent, or Firm—Scott A. McBain

(57) ABSTRACT

A sealed electronic module includes a housing having an open end for receiving a circuit board, and a slotted side wall for receiving a connector header mounted on the circuit board. The connector header fits snugly in the side wall slot and includes an integral trough that engages the interior face of the side wall to form a U-shaped channel that surrounds the sides and bottom of the slot. The housing is positioned with its open end upward, and potting material is dispensed onto the exposed surface of the circuit board in a single step to seal the circuit board to the housing. A portion of the potting material flows into and fills the U-shaped channel to seal the connector header to the housing.

6 Claims, 3 Drawing Sheets

US 6,964,575 B1

SEALED ELECTRONIC MODULE WITH SEAL-IN-PLACE CONNECTOR HEADER

TECHNICAL FIELD

The present invention relates to a sealed electronic module in which the module and its connector header are environmentally sealed in a single step.

BACKGROUND OF THE INVENTION

In the manufacture of an electronic module, various electronic components and a connector header are attached to a printed circuit board, and the assembly is inserted into a plastic or metal housing such that the header is aligned with a connector opening in a side-wall of the housing. The circuit board assembly may be secured to the housing with conventional fasteners or by dispensing potting material onto the exposed face of the circuit board as disclosed in the U.S. Pat. No. 5,703,754 to Hinze. The approach disclosed by Hinze is particularly advantageous because the potting material environmentally seals the module in addition to obviating the use of fasteners. However, some provision must be made for sealing an external electrical connector to the housing. In Hinze, for example, the external connector must seal against a collar protruding from a side wall of the housing. What is needed is a sealed module where potting material dispensed in a single step not only fastens and seals a circuit board in a housing, but also forms a seal between a connector header and the housing.

SUMMARY OF THE INVENTION

The present invention is directed to an electronic module including a housing having an open end for receiving a circuit board, and a slotted side wall for receiving a connector header mounted on the circuit board. The connector header fits snugly in the side wall slot and includes an integral trough that engages the interior face of the side wall to form a U-shaped channel that surrounds the sides and bottom of the slot. The housing is positioned with its open end upward, and potting material is dispensed onto the exposed surface of the circuit board in a single step to seal the circuit board to the housing. A portion of the potting material flows into and fills the U-shaped channel to seal the connector header to the housing. A set of small openings in the bottom of the channel allow air to vent from the channel as the potting material flows into and fills the channel while preventing potting material from entering the housing.

DESCRIPTION OF THE PREFERRED EMBODIMENT

Figure 1:
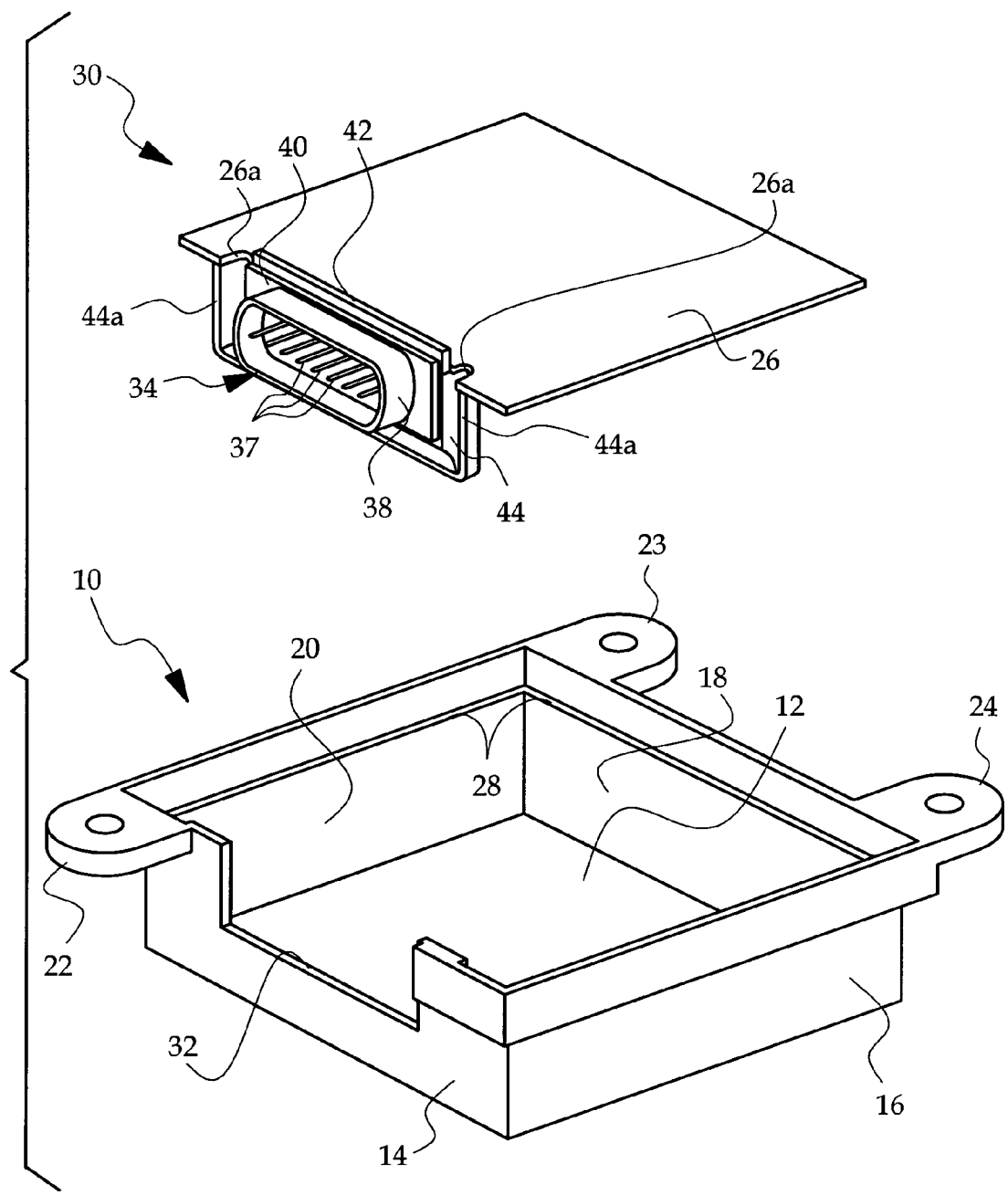
FIG. 1 is an exploded view of a housing and a connector header/circuit board assembly according to this invention.

Referring to FIG. 1, the reference numeral 10 generally designates a cast or molded housing and the reference numeral 30 generally designates a connector header/circuit board assembly. In general, the connector header/circuit board assembly 30 is installed into the housing 10, and then sealed in place with a potting material such as polyurethane.

Figure 4A:
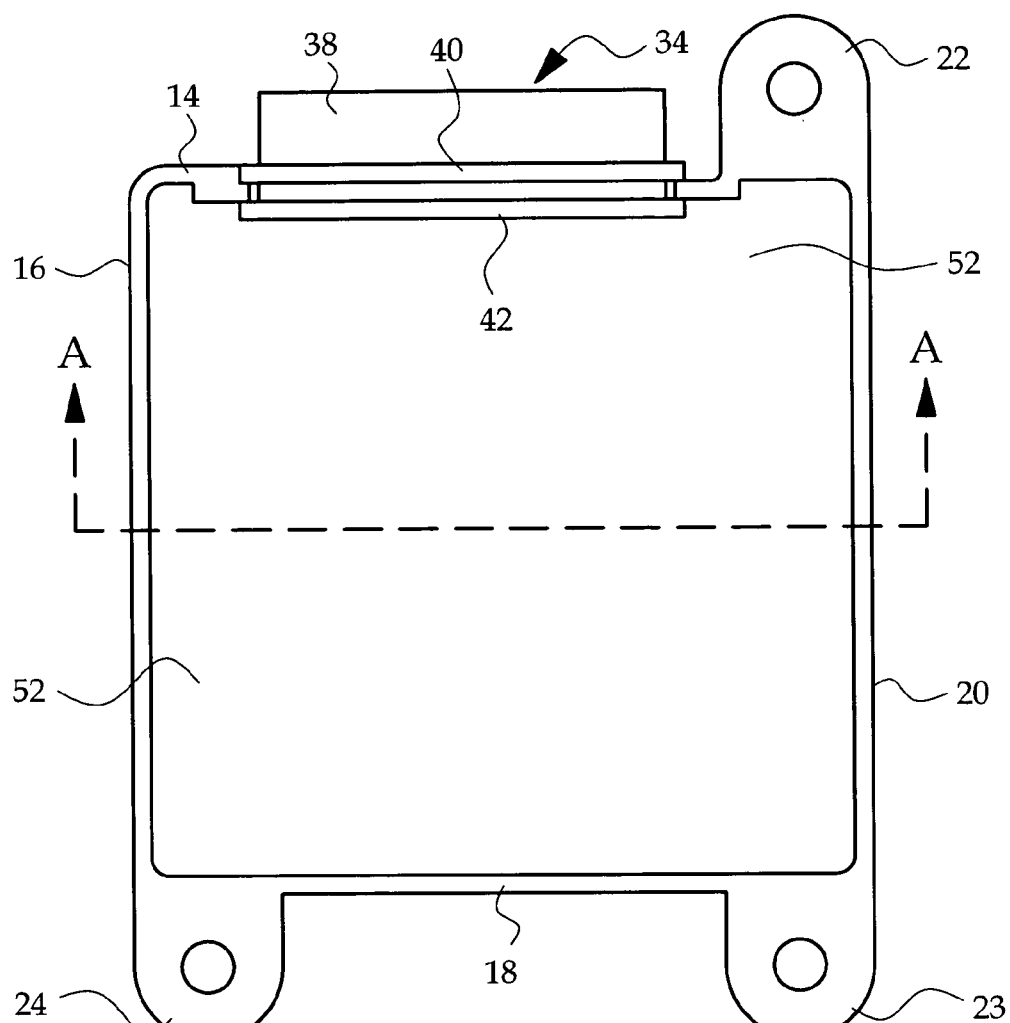
FIG. 4A is a top view of the completed electronic module of FIG. 3.
Figure 4B:
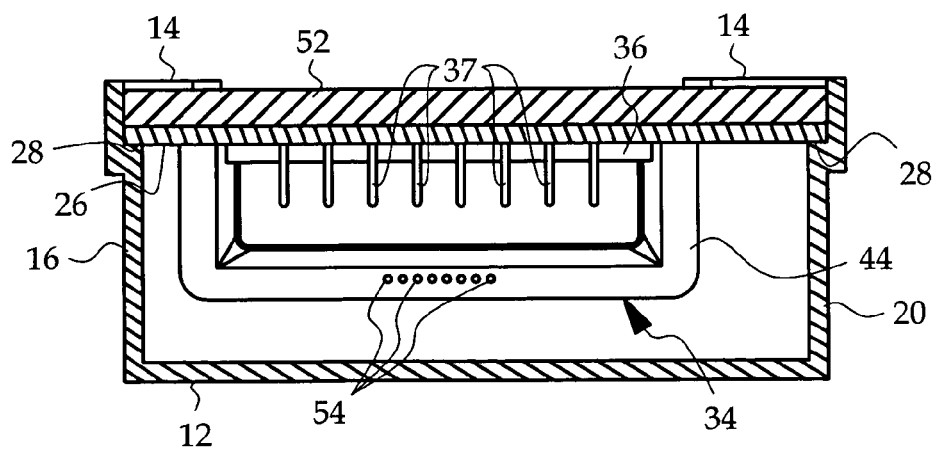
FIG. 4B is a cross-sectional view of the completed electronic module of FIG. 4A, taken along lines A—A of FIG. 4A.

The housing 10 includes a bottom 12, side walls 14, 16, 18, 20 and a set of integral mounting tabs 22, 23, 24. The housing 10 is open-ended as shown to receive a populated circuit board 26, and the interior faces of side walls 14, 16, 18, 20 are stepped to define an interior ledge 28 for peripherally supporting circuit board 26. The housing side wall 14 is slotted as indicated by the reference numeral 32 and a seal-in-place connector header 34 affixed to the circuit board 26 slides into the slot 32 when the circuit board 26 is installed in the housing 10. As seen in FIG. 4B, the portion of the circuit board 26 in the vicinity of slot 32 is supported by a ledge 36 formed on the inboard face of connector header 34.

The connector header 34 is a molded plastic part that supports and partially encases a set of metal terminals 37 that enable electrical communication between electronic devices mounted on circuit board 26 and various electronic components and modules disposed outside the housing 10. The inboard ends of terminals 37 bend toward the circuit board 26 and are soldered or mechanically fastened to conductor pads formed on the circuit board 26, as seen in FIG. 4B. The outboard ends of terminals 37 are laterally surrounded by a collar 38 designed to mate with the body of a complementary electrical connector, not shown.

The connector header 34 additionally includes a pair of spaced mounting flanges 40, 42 inboard of the collar 38, and a trough 44 extending laterally to the sides and bottom of flange 42. The flanges 40 and 42 straddle the housing slot 32 when the connector header/circuit board assembly 30 is installed into the housing 10. At the same time, a peripheral lip 44a of trough 44 is brought into engagement with the interior face of housing side wall 14, forming an open-ended U-shaped channel surrounding the side and bottom boundaries of slot 32. The edge of the circuit board 26 adjacent connector header 34 is undercut as indicated by the reference numerals 26a so that the circuit board 26 rests upon the upper walls of trough 44 without blocking the channel defined by trough 44 and side wall 14.

Figure 2:
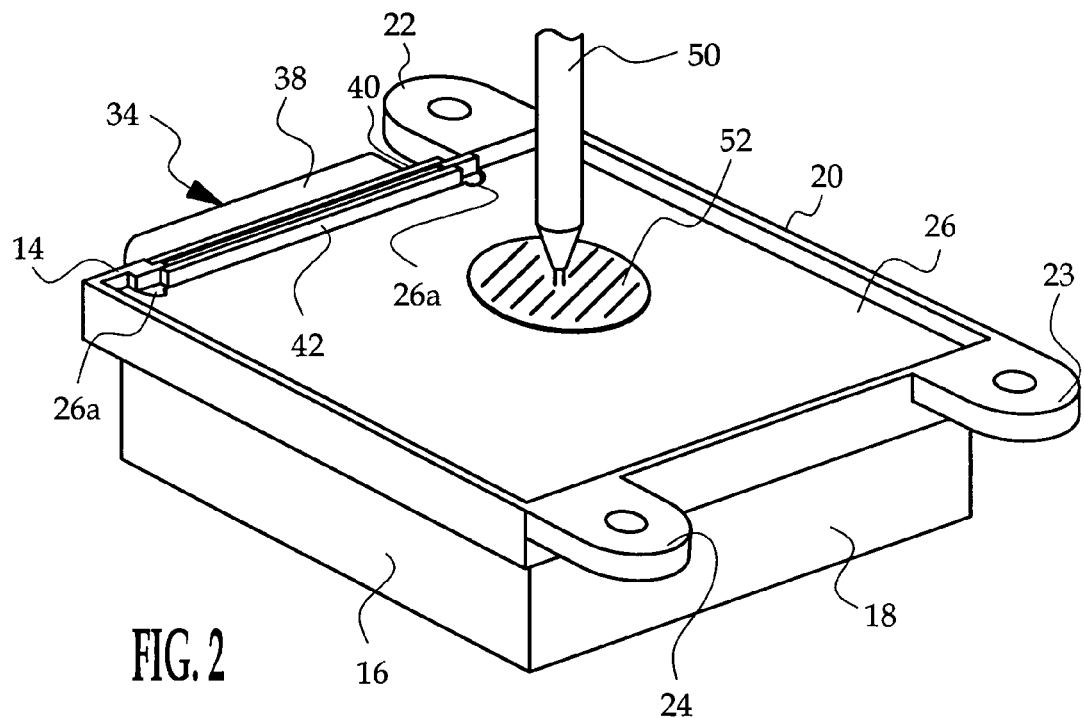
FIG. 2 illustrates potting material being dispensed onto an exposed face of the circuit board following installation of the connector header/circuit board assembly into the housing.
Figure 3:
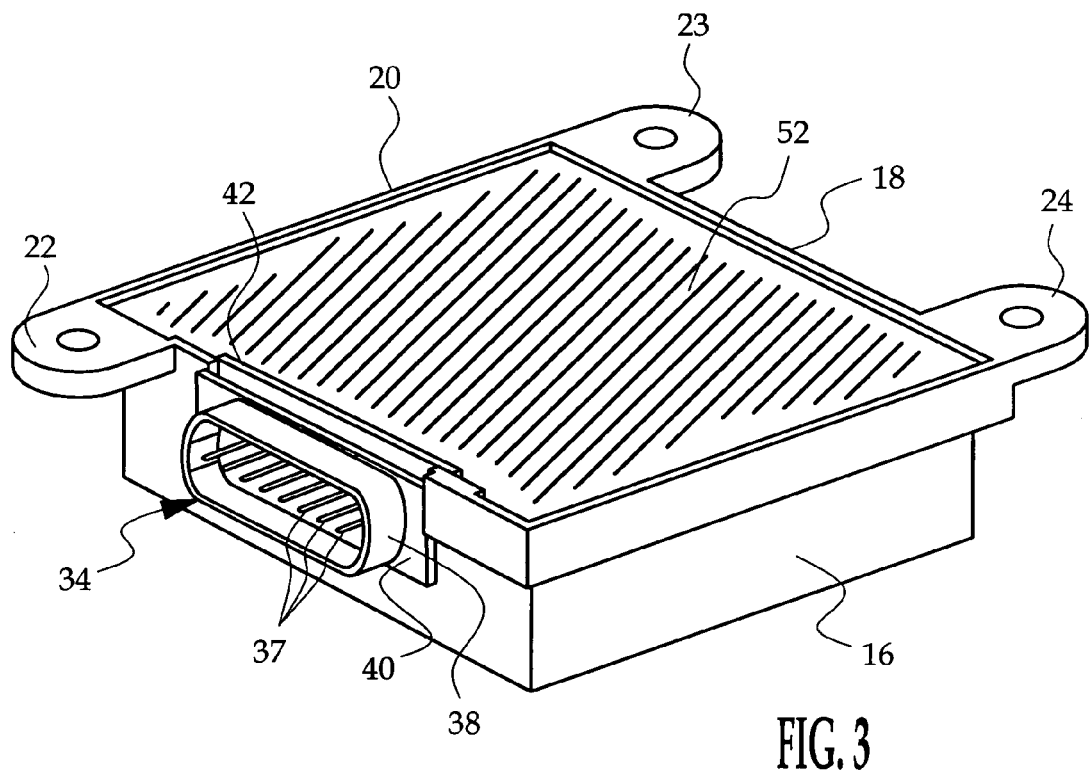
FIG. 3 is an isometric view of the completed electronic module.

Referring to FIG. 2, the housing 10 is positioned with its open end upward following installation of the connector header/circuit board assembly 30, and a dispensing nozzle 50 is positioned over the exposed face of circuit board 26. The nozzle 50 dispenses a predetermined quantity of potting material 52 such as polyurethane that has an initial free-flowing state, and that chemically cures to a hardened state. The potting material 52 spreads over the exposed face of circuit board 26, and flows into and fills the U-shaped channel defined by trough 44 and side wall 14. A set of small openings 54 in the bottom of trough 44 allow air to vent from the channel as the potting material 52 flows into and fills the channel; the openings 54 have a diameter relative to the viscosity of the uncured potting material such that substantially none of the potting material 52 will pass therethrough. The dispensed quantity of potting material 52 is sufficient to both fill the channel around housing slot 32 and completely cover the circuit board 26, as shown in FIG. 3. The connector header flange 42 seals the connector header 34 against the interior periphery of housing side wall 14 so that none of the potting material 52 leaks out of the housing 10. When the potting material 52 cures and hardens, it fastens and seals the circuit board 26 in housing 10, and also forms an environmental seal between connector header 34 and housing side wall 14. Only a small amount of potting material is required, which contributes to low cost and low weight of the completed electronic module.

In summary, the present invention provides a sealed electronic module with a seal-in-place connector header 34, where potting material 52 dispensed in a single step to both seal the circuit board 26 and the connector header 34. While the method of the present invention has been described in reference to the illustrated embodiment, it will be recognized that various modifications will occur to those skilled in the art. For example, the housing 10 may have a shape other than rectangular, and so on. Accordingly, it will be understood that modules incorporating these and other modifications may fall within the scope of this invention, which is defined by the appended claims.

I claim:

1. A sealed electronic module including an open-ended housing and a circuit board received in said housing, where said circuit board is sealed in said housing by dispensing a quantity of potting material onto an outboard face of said circuit board, said module additionally comprising:
    a slot formed in a side wall of said housing;
    an electrical connector header attached to said circuit board and having an outboard portion that protrudes through said slot when said circuit board is received in said housing; and
    a channel surrounding said slot, and being defined by an inboard portion of said connector header and an interior face of said side wall, such that a portion of the potting material dispensed onto said circuit board enters and substantially fills said channel to additionally seal said connector header to said housing.

2. The sealed electronic module of claim 1, wherein the inboard portion of said connector header includes a flange that engages the interior face of said side wall about said slot to prevent the dispensed potting material from leaking through said slot.

3. The sealed electronic module of claim 1, wherein said connector header includes a pair of flanges that straddle said slot to prevent the dispensed potting material from leaking through said slot.

4. The sealed electronic module of claim 1, wherein said inboard portion of said connector header comprises:
    a laterally depending trough having a peripheral lip that engages the interior face of said side wall to define said channel.

5. The sealed electronic module of claim 4, further comprising:
    a plurality of openings formed in said trough to allow air to escape from said channel when said potting material enters said channel.

6. The sealed electronic module of claim 4, wherein said circuit board is supported in part by terminal portions of said trough, and said circuit board is undercut to expose an interior periphery of said trough so that the potting material dispensed onto said circuit board can flow into said channel.

* * * * *